US010529837B1

(12) United States Patent
Hung et al.

(10) Patent No.: US 10,529,837 B1
(45) Date of Patent: Jan. 7, 2020

(54) BIPOLAR JUNCTION TRANSISTOR

(71) Applicant: UNITED MICROELECTRONICS CORP., Hsin-Chu (TW)

(72) Inventors: Ching-Wen Hung, Tainan (TW); Meng-Chi Chiang, Taipei (TW); Yen-Chih Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/120,296

(22) Filed: Sep. 2, 2018

(51) Int. Cl.
H01L 29/737 (2006.01)
H01L 29/739 (2006.01)
H01L 29/08 (2006.01)
H01L 29/423 (2006.01)
H01L 29/417 (2006.01)
H01L 29/10 (2006.01)

(52) U.S. Cl.
CPC ...... H01L 29/7393 (2013.01); H01L 29/0808 (2013.01); H01L 29/0821 (2013.01); H01L 29/1008 (2013.01); H01L 29/41708 (2013.01); H01L 29/42304 (2013.01)

(58) Field of Classification Search
None
See application file for complete search history.

(56) References Cited

U.S. PATENT DOCUMENTS 8,610,241 B1 12/2013 Hu
9,991,367 B1 6/2018 Pan
2018/0068998 A1* 3/2018 Wang ............... H01L 27/0207

* cited by examiner

Primary Examiner — Grant S Withers
(74) Attorney, Agent, or Firm — Winston Hsu

(57) ABSTRACT

A bipolar junction transistor (BJT) includes an emitter region, abase region on one side of the emitter region, and a collector region on the other side of the base region. The emitter region includes first fins extending along a first direction, a first metal gate extending across the first fins along a second direction, a second metal gate in parallel with the first metal gate, and an emitter contact plug on the first fins between the first metal gate and the second metal gate. The base region includes second fins extending along the first direction, the first metal gate and the second metal gate extending across the second fins along the second direction, and a base contact plug on the second fins between the first metal gate and the second metal gate. The emitter contact plug is aligned with the base contact plug.

16 Claims, 6 Drawing Sheets

BIPOLAR JUNCTION TRANSISTOR

BACKGROUND OF THE INVENTION

1. Field of the Invention

The present invention relates to the field of semiconductor technology, and in particular to a bipolar junction transistor (BJT).

2. Description of the Prior Art

In recent years, as various kinds of consumer electronic products are being constantly modified towards increased miniaturization, the size of semiconductor components are modified to be reduced accordingly, in order to meet high integration, high performance, low power consumption, and the demand of products. However, with the increasing miniaturization of electronic products, current planar field effect transistors (FETs) no longer meet the requirements of the products. Thus, there is a development for non-planar FETs such as Fin-FETs to achieve a high drive current and to lessen the short channel effect.

However, integrated circuit (IC) devices including complementary metal oxide semiconductor CMOS FinFETs also require other semiconductor structures and transistors, such as diodes and bipolar junction transistors (BJTs). These other semiconductor structures and transistors are formed alongside and concurrently with the FinFETs using the same materials and processes preferably. Because the FinFET basically has a three-dimensional structure, the forming method thereof is more complicated than that of the traditional structure, and it is difficult to integrate FinFET forming method into conventional planar FET forming method and the method of forming other semiconductor structures and transistors.

As known in the art, BJTs are manufactured in two types, NPN and PNP, and are available as individual, discrete components, or fabricated in integrated circuits such as signal amplifiers, digital circuits, or switch circuits. For example, PNP BJTs are mainstream adopted by the semiconductor industry, which are typically used in Band Gap Reference (BGR) circuits in a chip. However, the conventional PNP BJTs suffer from low beta (current gain) issue. It is desired to provide an improved BJT structure with enhanced beta/current gain and reduced device area.

SUMMARY OF THE INVENTION

It is one object of the present invention to provide an improved bipolar junction transistor (BJT) structure with enhanced beta/current gain and reduced device area.

According to one embodiment, a bipolar junction transistor (BJT) includes a substrate, an emitter region disposed on the substrate, a base region disposed on one side of the emitter region, and a collector region disposed on the other side of the base region and opposite to the emitter region. The emitter region includes a plurality of first fins extending along a first direction, a first metal gate extending across the plurality of first fins along a second direction, a second metal gate disposed in parallel with the first metal gate, and an emitter contact plug on the plurality of first fins elongating along the second direction between the first metal gate and the second metal gate. The base region includes a plurality of second fins extending along the first direction, the first metal gate and the second metal gate extending across the plurality of second fins along the second direction, and a base contact plug on the plurality of second fins elongating along the second direction between the first metal gate and the second metal gate. The emitter contact plug is aligned with the base contact plug.

According to one embodiment, a bipolar junction transistor includes a substrate, an emitter region disposed on the substrate, a base region surrounding the emitter region, and a collector region surrounding the base region. The emitter region includes a plurality of first fins extending along a first direction, a first metal gate extending across the plurality of first fins along a second direction, a second metal gate disposed in parallel with the first metal gate, and an emitter contact plug on the plurality of first fins elongating along the second direction between the first metal gate and the second metal gate. The base region includes a plurality of second fins extending along the first direction, the first metal gate and the second metal gate extending across the plurality of second fins along the second direction, and a base contact plug on the plurality of second fins elongating along the second direction between the first metal gate and the second metal gate. The emitter contact plug is aligned with the base contact plug.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
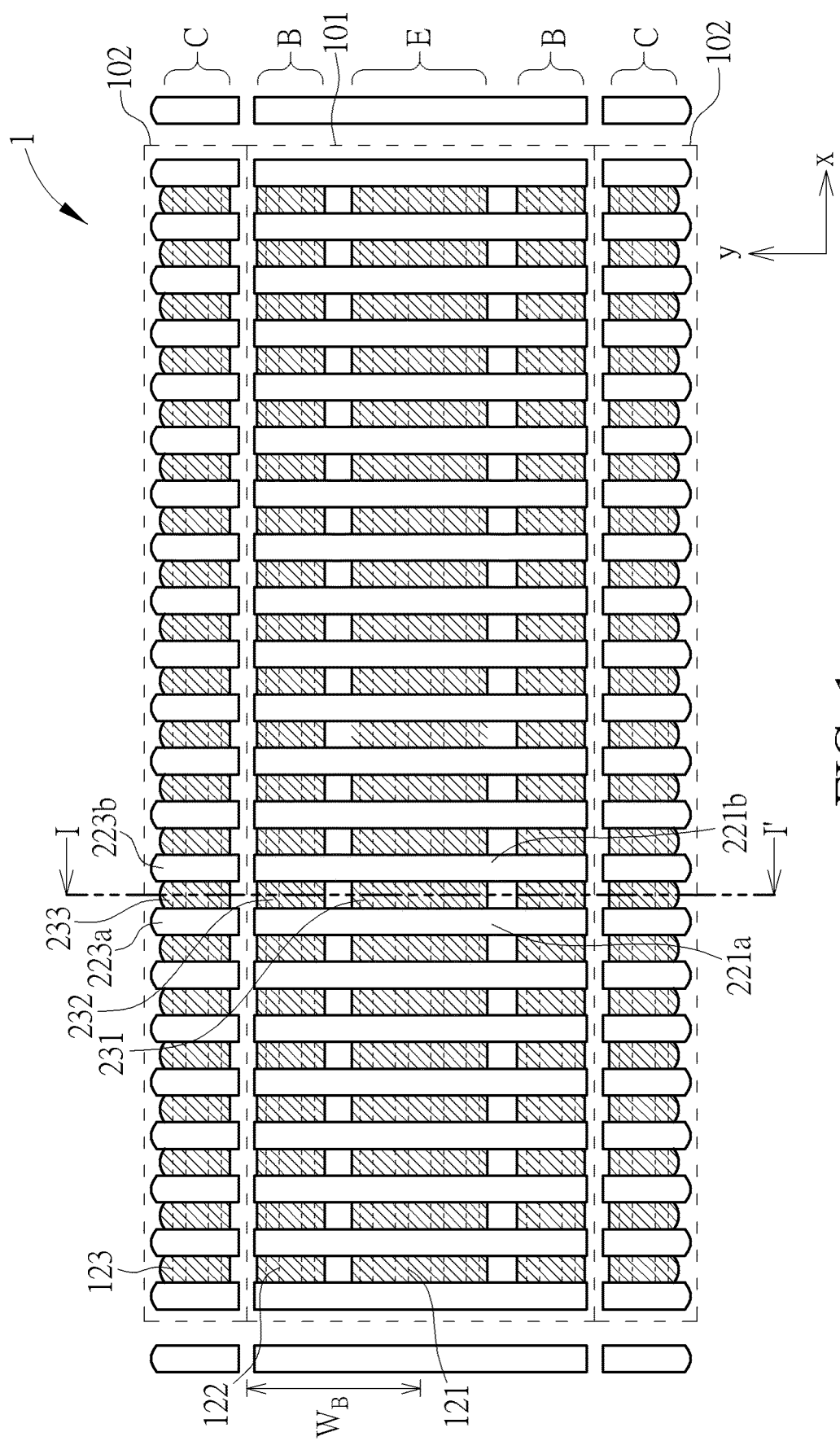
FIG. 1 is a schematic top view of a bipolar junction transistor (BJT) according to an embodiment of the present invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The present invention pertains to a bipolar junction transistor (BJT) fabricated in integrated circuits including but not limited to signal amplifiers, digital circuits, or switch circuits. For example, according to one embodiment of the invention, the illustrated BJT may be a PNP BJT and may be employed in a Band Gap Reference (BGR) circuit of an integrated circuit (IC) chip. However, it is to be understood that the present invention may be applicable to NPN BJTs. It should be recognized that although the present invention has been illustrated schematically with the use of certain conductivity types, the opposite conductive types can also be implemented.

Figure 2:
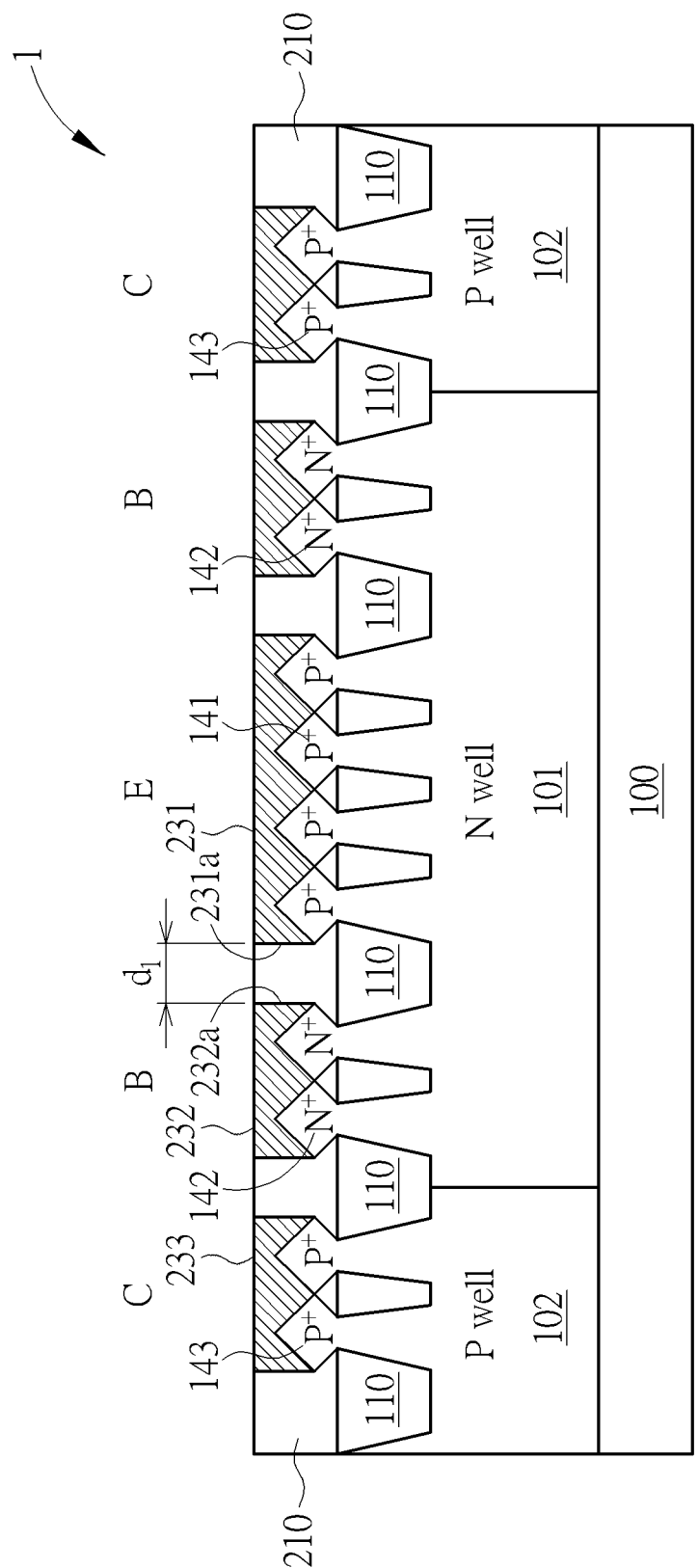
FIG. 2 is a schematic cross-sectional view of a portion of the emitter region taken along line I-I' in FIG. 1.

Please refer to FIG. 1 and FIG. 2. FIG. 1 is a schematic top view of a bipolar junction transistor according to an embodiment of the present invention. FIG. 2 is a schematic cross-sectional view of a portion of the emitter region taken along line I-I' in FIG. 1. As shown in FIG. 1 and FIG. 2, the bipolar junction transistor (BJT) 1 includes a substrate 100. The substrate 100 may be a semiconductor substrate of a first conductivity type such as a P-type silicon substrate, but is not limited thereto. An emitter region E is disposed on the substrate 100, a base region B is disposed on one side of the emitter region E, and a collector region C is disposed on the other side of the base region B and is opposite to the emitter region E.

According to one embodiment of the invention, a first ion well 101 of a second conductivity type such as an N well is provided in the substrate 100. The emitter region E and the base region B are disposed within the first ion well 101. According to one embodiment of the invention, a second ion well 102 of the first conductivity type such as a P well, which surrounds the first ion well 101, is provided in the substrate 100. The collector region C is disposed in the second ion well 102. It is to be understood that although a PNP BJT is illustrated as an example, the skilled artisan should be able to apply the disclosed embodiments directly or indirectly to an NPN BJT.

According to one embodiment of the invention, the emitter region E may include a plurality of first fins 121 such as four first fins extending along a first direction (i.e., the reference x-axis), a first metal gate 221a extending across the plurality of first fins 121 along a second direction (i.e., the reference y-axis), a second metal gate 221b disposed in parallel with the first metal gate 221a, and an emitter contact plug 231 on the plurality of first fins 121 elongating along the second direction between the first metal gate 221a and the second metal gate 221b.

The base region B includes a plurality of second fins 122 such as two second fins extending along the first direction (i.e., the reference x-axis), the first metal gate 221a and the second metal gate 221b continuously extending from the emitter region E and extending across the plurality of second fins 122 along the second direction, and a base contact plug 232 on the plurality of second fins 122 elongating along the second direction between the first metal gate 221a and the second metal gate 221b. According to one embodiment of the invention, the emitter contact plug 231 is aligned with the base contact plug 232 along the second direction. The first metal gate 221a and the second metal gate 221b stride across the plurality of first fins 121 and the plurality of second fins 122 along the second direction.

According to one embodiment of the invention, since the first metal gate 221a and the second metal gate 221b may be fabricated by conventional replacement metal gate (RMG) processes well known in the art, the detailed structure of the first metal gate 221a and the second metal gate 221b is therefore not shown for the sake of simplicity. For example, the first metal gate 221a and the second metal gate 221b may comprise a high-k gate dielectric layer, a barrier layer, a work-function metal layer, a low-resistance metal layer, or the like, but should not be limited thereto. According to one embodiment of the invention, the first metal gate 221a and the second metal gate 221b may comprise a sacrificial cap layer such as a silicon nitride layer. Basically, these metal gates 221a and 221b are electrically floating during the operation of the BJT 1. However, it is to be understood that in some cases, depending upon design requirements, some of these metal gates 221a and 221b may be electrically coupled to ground.

Figure 3:
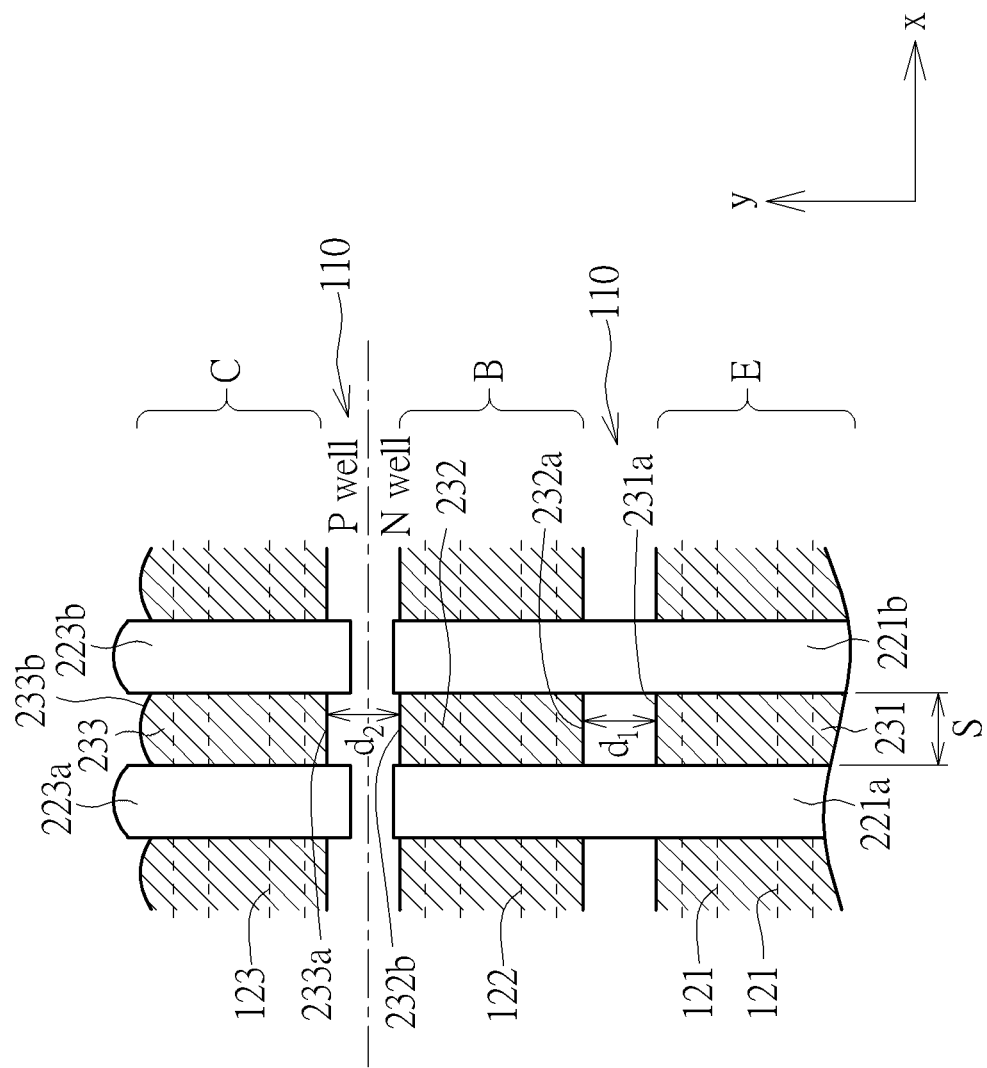
FIG. 3 is a schematic, enlarged view of a germane portion of the BJT in FIG. 1.

Please also refer to FIG. 3. FIG. 3 is a schematic, enlarged view of a germane portion of the bipolar junction transistor (BJT) 1 in FIG. 1. As shown in FIG. 1 to FIG. 3, for example, a space S between the first metal gate 221a and the second metal gate 221b may be smaller or equal to 0.118 micrometers. Both the emitter contact plug 231 and the base contact plug 232 have a width in the first direction that is the same as the space S between the first metal gate 221a and the second metal gate 221b. The emitter contact plug 231 has a first distal end 231a facing the base region B and the base contact plug 232 has a second distal end 232a facing the emitter region E. For example, the distance $d_1$ between the first distal end 231a and the second distal end 232a may range between 60 nm and 130 nm, which is much smaller than that of the prior art BJTs. By shrinking the distance $d_1$ between the first distal end 231a and the second distal end 232a, the base width ($W_B$) is decreased and thus the beta or current gain of the BJT 1 can be improved. Herein, the base width ($W_B$) is defined as the distance along the second direction between the PN junction between the first ion well 101 and the second ion well 102 and the imaginary center line of the emitter region E.

According to one embodiment of the invention, the collector region C comprises a plurality of third fins 123 such as two or more third fins extending along the first direction, a third metal gate 223a and a fourth metal gate 223b extending across the plurality of third fins 123 along the second direction, and a collector contact plug 233 on the plurality of third fins 123 elongating along the second direction between the third metal gate 223a and the fourth metal gate 223b. The base contact plug 232 has a third distal end 232b facing the collector region C and the collector contact plug 233 has a fourth distal end 233a facing the base region B. For example, the distance $d_2$ between the third distal end 232b and the fourth distal end 233a may range between 60 nm and 130 nm, which is much smaller than that of the prior art BJTs. By shrinking the distance $d_2$ between the third distal end 232b and the fourth distal end 233a, the base width (W$_B$) is decreased and thus the beta or current gain of the BJT 1 can be improved.

According to one embodiment of the invention, the collector contact plug 233 has a fifth distal end 233b that is opposite to the fourth distal end 233a. According to one embodiment of the invention, the curvature of the edge contour of the fifth distal end 233b is larger than that of the fourth distal end 233b. As can be seen in FIG. 3, the edge contour of the fourth distal end 233a is approximately a horizontal straight line in parallel with the reference x-axis (i.e. a flat end), while the edge contour of the fifth distal end 233b is approximately a curved line.

According to one embodiment of the invention, as can be best seen in FIG. 2, first epitaxial structures 141 such as SiGe or SiP epitaxial structures are disposed on the first fins 121, respectively. The first epitaxial structures 141 may be in direct contact with one another and may be heavily doped with P type dopants. According to one embodiment of the invention, as can be best seen in FIG. 2, the emitter contact plug 231 is disposed directly on the first epitaxial structures 141.

According to one embodiment of the invention, as can be best seen in FIG. 2, second epitaxial structures 142 such as SiGe or SiP epitaxial structures are disposed on the second fins 122, respectively. The second epitaxial structures 142 may be in direct contact with one another and may be heavily doped with N type dopants. According to one embodiment of the invention, as can be best seen in FIG. 2, the base contact plug 232 is disposed directly on the second epitaxial structures 142.

According to one embodiment of the invention, as can be best seen in FIG. 2, third epitaxial structures 143 such as SiGe or SiP epitaxial structures are disposed on the third fins 123, respectively. The third epitaxial structures 143 may be in direct contact with one another and may be heavily doped with P type dopants. According to one embodiment of the invention, as can be best seen in FIG. 2, the collector contact plug 233 is disposed directly on the third epitaxial structures 143.

According to one embodiment of the invention, as can be best seen in FIG. 2, the first epitaxial structures 141, the emitter contact plug 231, the second epitaxial structures 142, the base contact plug 232, the third epitaxial structures 143, and the collector contact plug 233 are surrounded by an inter-layer dielectric (ILD) layer 210. According to one embodiment of the invention, as can be best seen in FIG. 2, the top surfaces of the emitter contact plug 231, the base contact plug 232, and the collector contact plug 233 are coplanar with the top surface of the ILD layer 210.

Figure 4:
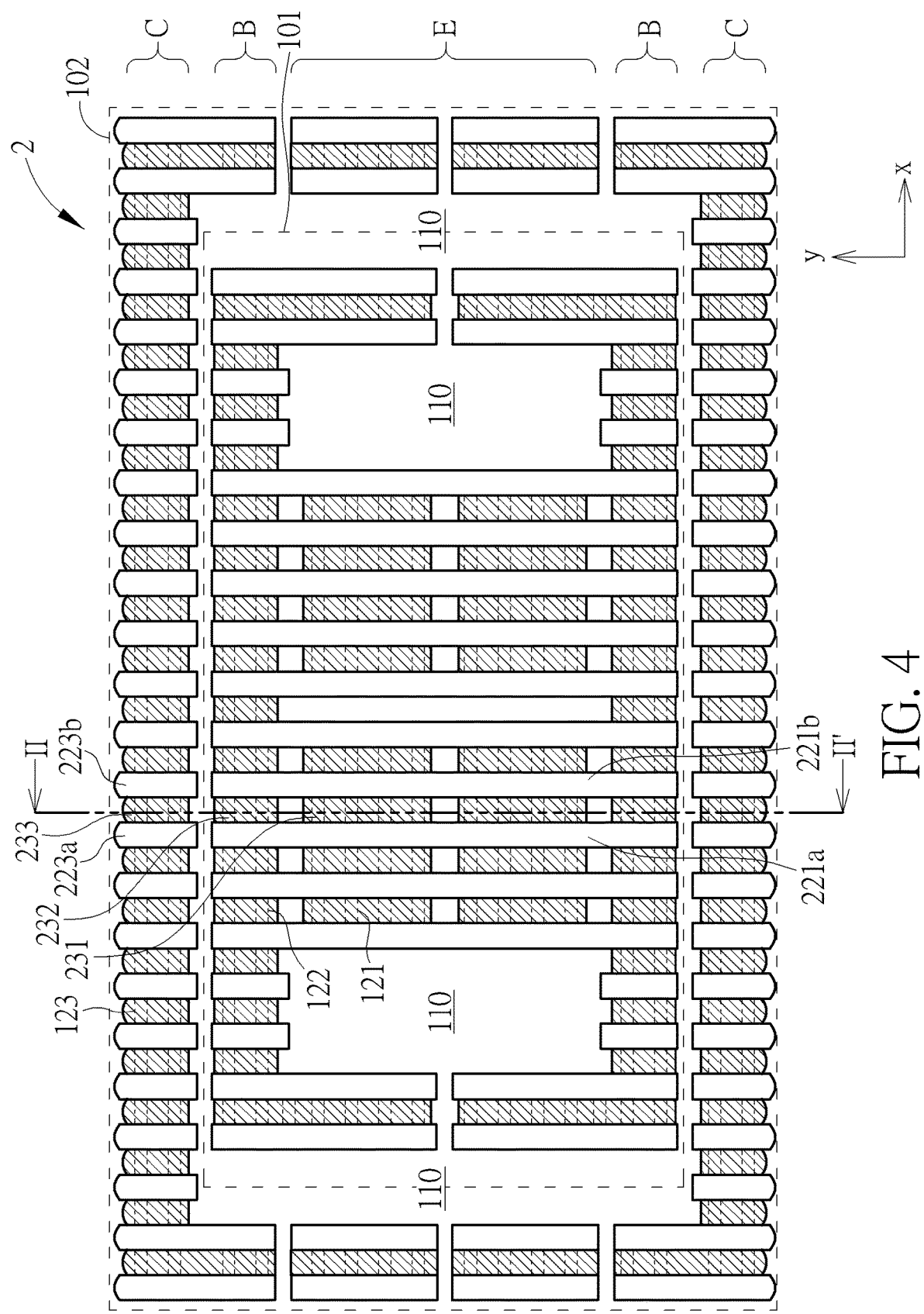
FIG. 4 is a schematic top view of a BJT according to another embodiment of the present invention.
Figure 5:
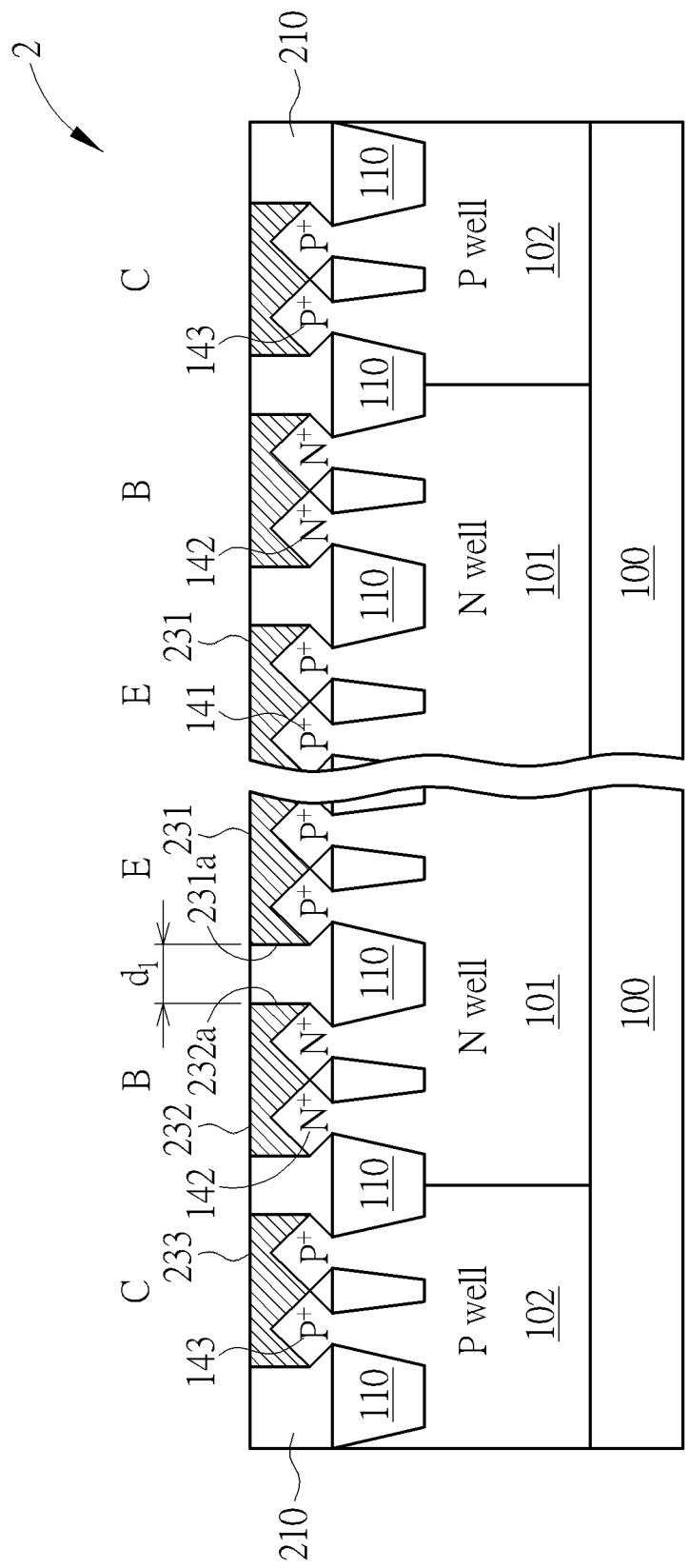
FIG. 5 is a schematic cross-sectional view of a portion of the emitter region taken along line II-II' in FIG. 4.

Please refer to FIG. 4 and FIG. 5. FIG. 4 is a schematic top view of a bipolar junction transistor according to another embodiment of the present invention. FIG. 5 is a schematic cross-sectional view of a portion of the emitter region taken along line II-II' in FIG. 4. Like regions, layers or elements are designated by like numeral numbers. As shown in FIG. 4 and FIG. 5, the bipolar junction transistor (BJT) 2 includes a substrate 100. The substrate 100 may be a semiconductor substrate of a first conductivity type such as a P-type silicon substrate, but is not limited thereto. An emitter region E is disposed on the substrate 100. A base region B surrounds the emitter region E. A collector region C surrounds the base region B.

According to one embodiment of the invention, a first ion well 101 of a second conductivity type such as an N well is provided in the substrate 100. The emitter region E and the base region B are disposed within the first ion well 101.

According to one embodiment of the invention, am annular second ion well 102 of the first conductivity type such as a P well, which surrounds the first ion well 101, is provided in the substrate 100. The collector region C is disposed in the second ion well 102. It is to be understood that although a PNP BJT is illustrated as an example, the skilled artisan should be able to apply the disclosed embodiments directly or indirectly to an NPN BJT.

According to one embodiment of the invention, the emitter region E may include a plurality of first fins 121 extending along a first direction (i.e., the reference x-axis), a first metal gate 221a extending across the plurality of first fins 121 along a second direction (i.e., the reference y-axis), a second metal gate 221b disposed in parallel with the first metal gate 221a, and an emitter contact plug 231 on the plurality of first fins 121 elongating along the second direction between the first metal gate 221a and the second metal gate 221b.

The base region B includes a plurality of second fins 122 such as two second fins extending along the first direction (i.e., the reference x-axis), the first metal gate 221a and the second metal gate 221b continuously extending from the emitter region E and extending across the plurality of second fins 122 along the second direction, and a base contact plug 232 on the plurality of second fins 122 elongating along the second direction between the first metal gate 221a and the second metal gate 221b. According to one embodiment of the invention, the emitter contact plug 231 is aligned with the base contact plug 232 along the second direction. The first metal gate 221a and the second metal gate 221b stride across the plurality of first fins 121 and the plurality of second fins 122 along the second direction.

According to one embodiment of the invention, since the first metal gate 221a and the second metal gate 221b may be fabricated by conventional replacement metal gate (RMG) processes well known in the art, the detailed structure of the first metal gate 221a and the second metal gate 221b is therefore not shown for the sake of simplicity. For example, the first metal gate 221a and the second metal gate 221b may comprise a high-k gate dielectric layer, a barrier layer, a work-function metal layer, a low-resistance metal layer, or the like, but should not be limited thereto. According to one embodiment of the invention, the first metal gate 221a and the second metal gate 221b may comprise a sacrificial cap layer such as a silicon nitride layer. Basically, these metal gates 221a and 221b are electrically floating during the operation of the BJT 1. However, it is to be understood that in some cases, depending upon design requirements, some of these metal gates 221a and 221b may be electrically coupled to ground.

Figure 6:
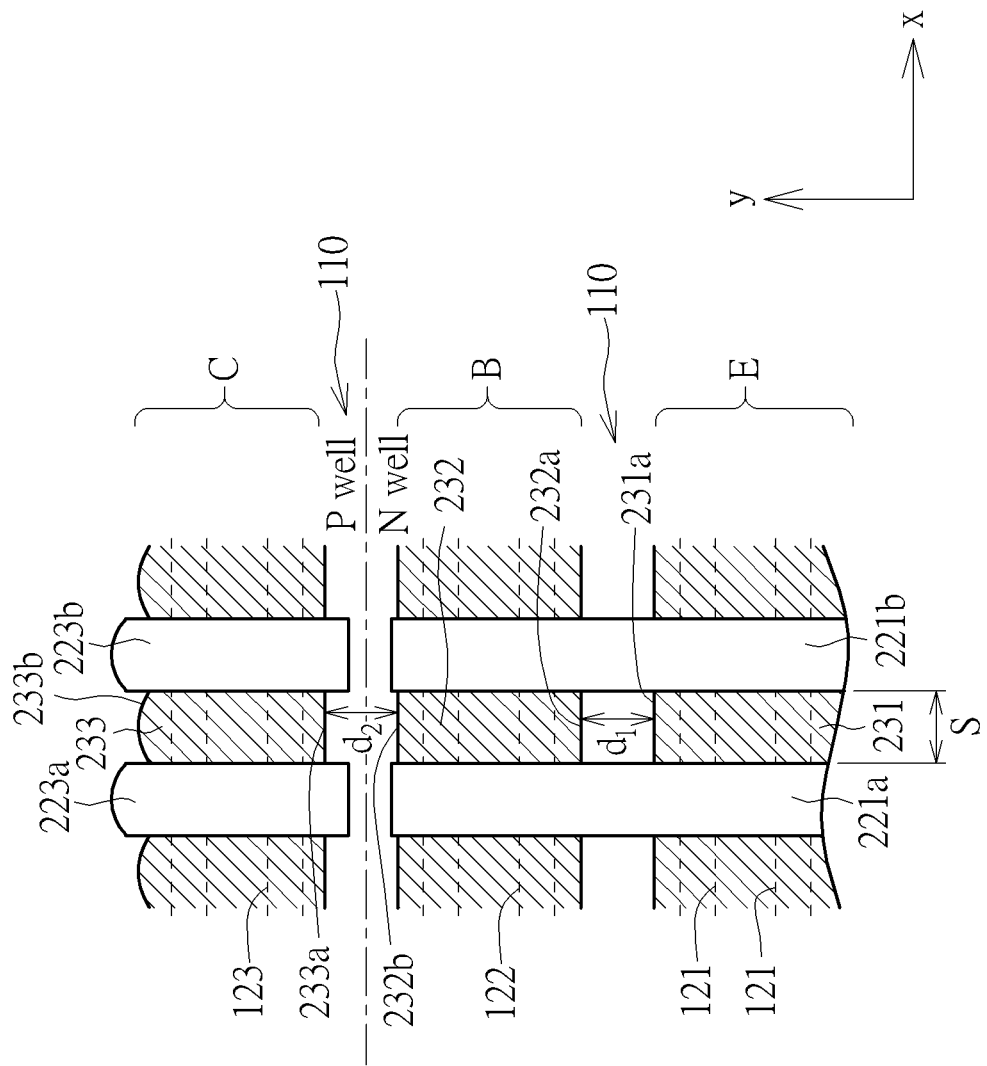
FIG. 6 is a schematic, enlarged view of a germane portion of the BJT in FIG. 4.

Please also refer to FIG. 6. FIG. 6 is a schematic, enlarged view of a germane portion of the BJT 2 in FIG. 4. As shown in FIG. 4 to FIG. 6, for example, a space S between the first metal gate 221a and the second metal gate 221b may be smaller or equal to 0.118 micrometers. Both the emitter contact plug 231 and the base contact plug 232 have a width in the first direction that is the same as the space S between the first metal gate 221a and the second metal gate 221b. The emitter contact plug 231 has a first distal end 231a facing the base region B and the base contact plug 232 has a second distal end 232a facing the emitter region E. For example, the distance $d_1$ between the first distal end 231a and the second distal end 232a may range between 60 nm and 130 nm which is much smaller than that of the prior art BJTs. By shrinking the distance $d_1$ between the first distal end 231a and the second distal end 232a, the base width (W$_B$) is decreased and thus the beta or current gain of the BJT 2 can be improved. Herein, the base width ($W_B$) is defined as the distance along the second direction between the PN junction between the first ion well 101 and the second ion well 102 and the imaginary center line of the emitter region E.

According to one embodiment of the invention, the collector region C comprises a plurality of third fins 123 such as two or more third fins extending along the first direction, a third metal gate 223a and a fourth metal gate 223b extending across the plurality of third fins 123 along the second direction, and a collector contact plug 233 on the plurality of third fins 123 elongating along the second direction between the third metal gate 223a and the fourth metal gate 223b. The base contact plug 232 has a third distal end 232b facing the collector region C and the collector contact plug 233 has a fourth distal end 233a facing the base region B. For example, the distance $d_2$ between the third distal end 232b and the fourth distal end 233a may range between 60 nm and 130 nm, which is much smaller than that of the prior art BJTs. By shrinking the distance $d_2$ between the third distal end 232b and the fourth distal end 233a, the base width ($W_B$) is decreased and thus the beta or current gain of the BJT 2 can be improved.

According to one embodiment of the invention, the collector contact plug 233 has a fifth distal end 233b that is opposite to the fourth distal end 233a. According to one embodiment of the invention, the curvature of the edge contour of the fifth distal end 233b is larger than that of the fourth distal end 233b. As can be seen in FIG. 3, the edge contour of the fourth distal end 233a is approximately a horizontal straight line in parallel with the reference x-axis (i.e. a flat end), while the edge contour of the fifth distal end 233b is approximately a curved line.

According to one embodiment of the invention, as can be best seen in FIG. 5, first epitaxial structures 141 such as SiGe or SiP epitaxial structures are disposed on the first fins 121, respectively. The first epitaxial structures 141 may be in direct contact with one another and may be heavily doped with P type dopants. According to one embodiment of the invention, as can be best seen in FIG. 5, the emitter contact plug 231 is disposed directly on the first epitaxial structures 141.

According to one embodiment of the invention, as can be best seen in FIG. 5, second epitaxial structures 142 such as SiGe or SiP epitaxial structures are disposed on the second fins 122, respectively. The second epitaxial structures 142 may be in direct contact with one another and may be heavily doped with N type dopants. According to one embodiment of the invention, as can be best seen in FIG. 5, the base contact plug 232 is disposed directly on the second epitaxial structures 142.

According to one embodiment of the invention, as can be best seen in FIG. 5, third epitaxial structures 143 such as SiGe or SiP epitaxial structures are disposed on the third fins 123, respectively. The third epitaxial structures 143 may be in direct contact with one another and may be heavily doped with P type dopants. According to one embodiment of the invention, as can be best seen in FIG. 5, the collector contact plug 233 is disposed directly on the third epitaxial structures 143.

According to one embodiment of the invention, as can be best seen in FIG. 5, the first epitaxial structures 141, the emitter contact plug 231, the second epitaxial structures 142, the base contact plug 232, the third epitaxial structures 143, and the collector contact plug 233 are surrounded by an inter-layer dielectric (ILD) layer 210. According to one embodiment of the invention, as can be best seen in FIG. 5, the top surfaces of the emitter contact plug 231, the base contact plug 232, and the collector contact plug 233 are coplanar with the top surface of the ILD layer 210.

It is advantageous to use the present invention because the chip area occupied by the BJT device is reduced and the beta or current gain is increased. These advantages or benefits are achieved by shrinking the distance $d_1$ between the first distal end 231a and the second distal end 232a and/or the distance $d_2$ between the third distal end 232b and the fourth distal end 233a. By shrinking the distance $d_1$ between the first distal end 231a and the second distal end 232a and/or the distance $d_2$ between the third distal end 232b and the fourth distal end 233a, the base width ($W_B$) is decreased and thus the beta or current gain can be improved and the occupied chip area of the BJT can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A bipolar junction transistor, comprising:
a substrate;
an emitter region being disposed on the substrate and comprising a plurality of first fins extending along a first direction, a first metal gate extending across the plurality of first fins along a second direction, a second metal gate disposed in parallel with the first metal gate, and an emitter contact plug on the plurality of first fins elongating along the second direction between the first metal gate and the second metal gate;
a base region disposed on one side of the emitter region, the base region comprising a plurality of second fins extending along the first direction, the first metal gate and the second metal gate extending across the plurality of second fins along the second direction, and a base contact plug on the plurality of second fins elongating along the second direction between the first metal gate and the second metal gate, wherein the emitter contact plug is aligned with the base contact plug; and
a collector region disposed on one side of the base region and being opposite to the emitter region, wherein the collector region comprises a plurality of third fins extending along the first direction, a third metal gate and a fourth metal gate extending across the plurality of third fins along the second direction, and a collector contact plug on the plurality of third fins elongating along the second direction between the third metal gate and the fourth metal gate, wherein the base contact plug has a third distal end facing the collector region and the collector contact plug has a fourth distal end facing the base region, wherein the collector contact plug has a fifth distal end opposite to the fourth distal end, and a curvature of the fifth distal end is larger than a curvature of the fourth distal end.

2. The bipolar junction transistor according to claim 1, wherein the first metal gate and the second metal gate stride across the plurality of first fins and the plurality of second fins along the second direction.

3. The bipolar junction transistor according to claim 1, wherein a space between the first metal gate and the second metal gate is smaller or equal to 0.118 micrometers.

4. The bipolar junction transistor according to claim 3, wherein the emitter contact plug and the base contact plug have a width in the first direction that is the same as the space between the first metal gate and the second metal gate.

5. The bipolar junction transistor according to claim 1, wherein the emitter contact plug has a first distal end facing the base region and the base contact plug has a second distal end facing the emitter region, and wherein a distance between the first distal end and the second distal end ranges between 60 nm and 130 nm.

6. The bipolar junction transistor according to claim 1, wherein the emitter region comprises four first fins and the base region comprises two second fins.

7. The bipolar junction transistor according to claim 1, wherein a distance between the third distal end and the fourth distal end ranges between 60 nm and 130 nm.

8. The bipolar junction transistor according to claim 1, wherein first, second, and third epitaxial structures are disposed on the plurality of first fins, the plurality of second fins, and the plurality of third fins, respectively.

9. A bipolar junction transistor, comprising:
- a substrate;
- an emitter region being disposed on the substrate and comprising a plurality of first fins extending along a first direction, a first metal gate extending across the plurality of first fins along a second direction, a second metal gate disposed in parallel with the first metal gate, and an emitter contact plug on the plurality of first fins elongating along the second direction between the first metal gate and the second metal gate;
- a base region surrounding the emitter region, the base region comprising a plurality of second fins extending along the first direction, the first metal gate and the second metal gate extending across the plurality of second fins along the second direction, and a base contact plug on the plurality of second fins elongating along the second direction between the first metal gate and the second metal gate, wherein the emitter contact plug is aligned with the base contact plug; and
- a collector region surrounding the base region, wherein the collector region comprises a plurality of third fins extending along the first direction, a third metal gate and a fourth metal gate extending across the plurality of third fins along the second direction, and a collector contact plug on the plurality of third fins elongating along the second direction between the third metal gate and the fourth metal gate, wherein the base contact plug has a third distal end facing the collector region and the collector contact plug has a fourth distal end facing the base region, wherein the collector contact plug has a fifth distal end opposite to the fourth distal end, and a curvature of the fifth distal end is larger than a curvature of the fourth distal end.

10. The bipolar junction transistor according to claim 9, wherein the first metal gate and the second metal gate stride across the plurality of first fins and the plurality of second fins along the second direction.

11. The bipolar junction transistor according to claim 9, wherein a space between the first metal gate and the second metal gate is smaller or equal to 0.118 micrometers.

12. The bipolar junction transistor according to claim 11, wherein the emitter contact plug and the base contact plug have a width in the first direction that is the same as the space between the first metal gate and the second metal gate.

13. The bipolar junction transistor according to claim 9, wherein the emitter contact plug has a first distal end facing the base region and the base contact plug has a second distal end facing the emitter region, and wherein a distance between the first distal end and the second distal end ranges between 60 nm and 130 nm.

14. The bipolar junction transistor according to claim 9, wherein the emitter region comprises four first fins and the base region comprises two second fins.

15. The bipolar junction transistor according to claim 9, wherein a distance between the third distal end and the fourth distal end ranges between 60 nm and 130 nm.

16. The bipolar junction transistor according to claim 9, wherein first, second, and third epitaxial structures are disposed on the plurality of first fins, the plurality of second fins, and the plurality of third fins, respectively.

* * * * *